(12) United States Patent
Huang et al.

(10) Patent No.: US 9,497,878 B2
(45) Date of Patent: Nov. 15, 2016

(54) RETAINING MECHANISM AND ELECTRONIC DEVICE HAVING THE RETAINING MECHANISM

(71) Applicant: Wistron Corporation, New Taipei (TW)

(72) Inventors: Wei-Chia Huang, New Taipei (TW); Sliphen Yang, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 14/727,880

(22) Filed: Jun. 2, 2015

(65) Prior Publication Data

US 2016/0234957 A1     Aug. 11, 2016

(30) Foreign Application Priority Data

Feb. 10, 2015   (CN) .......................... 2015 1 0069131

(51) Int. Cl.
*H05K 7/14*      (2006.01)

(52) U.S. Cl.
CPC ............. *H05K 7/1417* (2013.01); *H05K 7/142* (2013.01); *H05K 7/1404* (2013.01); *H05K 7/1405* (2013.01)

(58) Field of Classification Search
CPC .. H05K 7/1417; H05K 7/142; H05K 7/1404; H05K 7/1405
See application file for complete search history.

(56) References Cited

U.S. PATENT DOCUMENTS

| | | | | |
|---|---|---|---|---|
| 5,452,184 A | * | 9/1995 | Scholder | H05K 7/12 24/297 |
| 5,691,504 A | * | 11/1997 | Sands | G06F 1/182 174/372 |
| 5,801,928 A | * | 9/1998 | Burstedt | H05K 7/142 361/752 |
| 6,005,775 A | * | 12/1999 | Chiu | H05K 7/142 361/736 |
| 6,424,540 B1 | * | 7/2002 | Chen | G06F 1/184 174/377 |
| 6,785,146 B2 | * | 8/2004 | Koike | H05K 7/1417 361/740 |

(Continued)

FOREIGN PATENT DOCUMENTS

| | | |
|---|---|---|
| CN | 102512820 B | 12/2014 |
| JP | S5485360 U | 6/1979 |

(Continued)

OTHER PUBLICATIONS

Office action mailed on Oct. 27, 2015 for the Taiwan application No. 104107059, filed: Mar. 5, 2015, p. 1 line 13~14 and p. 2-3.

(Continued)

*Primary Examiner* — Adrian S Wilson
*Assistant Examiner* — Abhishek Rathod
(74) *Attorney, Agent, or Firm* — Winston Hsu; Scott Margo

(57) ABSTRACT

A retaining mechanism for holding a circuit board and a related electronic device include a supporter, a first fixing component, a second fixing component and a third fixing component. The first fixing component is disposed on a supporting wall of the supporter, to buckle an edge of the circuit board and to constrain a movement of the circuit board in a first direction. The second fixing component is disposed on another supporting wall of the supporter, to contact against another edge of the circuit board and to constrain a movement of the circuit board in a second direction. The third fixing component is disposed on a base of the supporter. A holding portion and a hooking unit of the third fixing component respectively holds a bottom of the circuit board and inserts into an opening on the circuit board, to prevent the circuit board and the holding portion from separation.

17 Claims, 10 Drawing Sheets

(56) References Cited

U.S. PATENT DOCUMENTS

| | | | | |
|---|---|---|---|---|
| 6,992,901 B1* | 1/2006 | Hung | .................... | H05K 9/0009 |
| | | | | 174/385 |
| 7,040,905 B1* | 5/2006 | Wang | .................... | H05K 7/1404 |
| | | | | 361/759 |
| 2006/0181841 A1* | 8/2006 | Chen | .................... | H04M 1/0266 |
| | | | | 361/679.3 |
| 2006/0279912 A1* | 12/2006 | Shi | ......................... | G06F 1/1662 |
| | | | | 361/679.08 |
| 2008/0049949 A1* | 2/2008 | Snider | .................... | H04B 1/082 |
| | | | | 381/86 |
| 2009/0067142 A1* | 3/2009 | Tsai | ..................... | H05K 7/1429 |
| | | | | 361/759 |
| 2010/0195304 A1 | 8/2010 | Takao | | |
| 2012/0120620 A1* | 5/2012 | Su | .......................... | H05K 5/069 |
| | | | | 361/752 |
| 2013/0003289 A1* | 1/2013 | Sun | ........................ | G06F 1/187 |
| | | | | 361/679.33 |
| 2013/0010416 A1* | 1/2013 | Chang | .................... | G06F 1/1662 |
| | | | | 361/679.08 |
| 2013/0120945 A1* | 5/2013 | Zhao | ...................... | H05K 7/142 |
| | | | | 361/759 |
| 2015/0189766 A1* | 7/2015 | Fan | ...................... | H05K 7/1417 |
| | | | | 312/223.2 |

FOREIGN PATENT DOCUMENTS

| | | |
|---|---|---|
| JP | S599587 U | 1/1984 |
| JP | H056968 U | 1/1993 |
| JP | H0645391 U | 6/1994 |
| JP | 2013238726 A | 11/2013 |
| TW | M353613 | 3/2009 |

OTHER PUBLICATIONS

Office action mailed/issued on Jul. 19, 2016 for JP application No. 2015-137399, filing date: Jul. 9, 2015, p. 2 line 3-33, pp. 3-4 and p. 5 line 1.

\* cited by examiner

RETAINING MECHANISM AND ELECTRONIC DEVICE HAVING THE RETAINING MECHANISM

BACKGROUND OF THE DISCLOSURE

1. Field of the Disclosure

The present disclosure relates to a circuit board retaining mechanism and a related electronic device, and more particularly, to a retaining mechanism for rapidly fixing a circuit board and an electronic device having the foresaid retaining mechanism.

2. Description of the Prior Art

Please refer to FIG. 10. FIG. 10 is a conventional circuit board retaining mechanism 60 in prior art. The conventional circuit board retaining mechanism 60 includes a base 62, a pedestal 64 and a fixing component 66. The pedestal 64 is disposed around or on corners of the base 62. The circuit board 68 is put inside the base 62, and a locking hole 70 on the circuit board 68 aligns with the pedestal 64, and the fixing component 66 passes through the locking hole 70 to be locked on the pedestal 64, so the circuit board 68 can be fixed inside the circuit board retaining mechanism 60. The conventional circuit board retaining mechanism 60 is operated to assemble and disassemble the fixing component 66 by an external tool. For example, the external tool is a screwdriver and the fixing component 66 is a bolt or a screw. While the locking hole 70 does not align with the pedestal 64 or the fixing component 66 does not accurately insert into the locking hole 70 and the pedestal 64, assembly/disassembly of the circuit board retaining mechanism 60 is difficult and components of the circuit board retaining mechanism 60 may be damaged. Thus, the conventional circuit board retaining mechanism 60 has drawbacks of inconvenient assembly and disassembly, unfavorable combination strength and unstable quality.

SUMMARY OF THE DISCLOSURE

The present disclosure provides a retaining mechanism for rapidly fixing a circuit board and an electronic device having the foresaid retaining mechanism for solving above drawbacks.

According to the claimed disclosure, a retaining mechanism for holding a circuit board, which includes a supporter, a first fixing component, a second fixing component and a third fixing component. The supporter has a base, a first supporting wall and a second supporting wall, the first supporting wall and the second supporting wall are respectively disposed on opposite sides of the base. The first fixing component is disposed on a surface of the first supporting wall facing the base, and the first fixing component is adapted to buckle a first edge of the circuit board to constrain a reciprocate movement of the circuit board in a first direction. An end of the second fixing component is resiliently connected to a surface of the second supporting wall facing the first supporting wall, the other end of the second fixing component contacts against a second edge of the circuit board opposite to the first edge to constrain a reciprocate movement of the circuit board in a second direction different from the first direction. The third fixing component is disposed on the base and located between the first supporting wall and the second supporting wall, and the third fixing component includes a holding portion adapted to hold a bottom of the circuit board.

According to the claimed disclosure, the first fixing component includes a first constraining portion and a second constraining portion disposed on the first supporting wall along the first direction and adjacent by each other, opposite surfaces of the circuit board are respectively held and pressed by the first constraining portion and the second constraining portion.

According to the claimed disclosure, a distance between the holding portion and the base is substantially equal to a distance between the first constraining portion and the base.

According to the claimed disclosure, the second fixing component includes a first slab portion and a second slab portion bent from each other, the first slab portion is resiliently disposed between the second supporting wall and the second slab portion, and the second slab portion is adapted to obliquely press the circuit board.

According to the claimed disclosure, the third fixing component further includes a hooking unit disposed adjacent by the holding portion, the hooking unit is buckled with an opening formed on the circuit board to constrain a relative movement of the circuit board and the holding portion.

According to the claimed disclosure, the hooking unit includes a protruding portion and a contacting portion, the contacting portion is connected to the holding portion, the protruding portion is disposed on a lateral surface of the contacting portion and points toward the second fixing component.

According to the claimed disclosure, the second fixing component pushes the circuit board to abut an inner wall of the opening of the circuit board against the contacting portion.

According to the claimed disclosure, the supporter further includes a third supporting wall disposed on a side of the base different from the first supporting wall and the second supporting wall, the retaining mechanism further includes a fourth fixing component, an end of the fourth fixing component is resiliently connected to the third supporting wall, and the other end of the fourth fixing component contacts against a third edge of the circuit board different from the first edge and the second edge, so as to move the circuit board in a third direction different from the first direction and the second direction.

According to the claimed disclosure, the fourth fixing component is an arc board, a flat board or a flexural board.

According to the claimed disclosure, the first fixing component, the second fixing component, the third fixing component and the fourth fixing component are formed on the supporter by press stamping process.

According to the claimed disclosure, an electronic device having a quick assembling function, which includes a housing, a circuit board, and a retaining mechanism for holding the circuit board inside the housing. The retaining mechanism includes a supporter, a first fixing component, a second fixing component and a third fixing component. The supporter is disposed inside the housing to accommodate the circuit board. The supporter has a base, a first supporting wall and a second supporting wall, the first supporting wall and the second supporting wall are respectively disposed on opposite sides of the base. The first fixing component is disposed on a surface of the first supporting wall facing the base, and the first fixing component is adapted to buckle a first edge of the circuit board to constrain a reciprocate movement of the circuit board in a first direction. An end of the second fixing component is resiliently connected to a surface of the second supporting wall facing the first supporting wall, the other end of the second fixing component contacts against a second edge of the circuit board opposite to the first edge to constrain a reciprocate movement of the circuit board in a second direction different from the first direction. The third fixing component is disposed on the base and located between the first supporting wall and the second supporting wall, and the third fixing component includes a holding portion adapted to hold a bottom of the circuit board.

According to the claimed disclosure, the housing includes an upper cover and a lower cover, the circuit board and the retaining mechanism are disposed inside the lower cover, and the upper cover is detachably assembled with the lower cover to shelter the circuit board and the retaining mechanism.

The retaining mechanism of the present disclosure disposes the first fixing component, the second fixing component, the third fixing component and the fourth fixing component around the supporter. An amount of each fixing component can be one or more. In the embodiment, each fixing component has two members symmetrically disposed on the corresponding supporting wall of the supporter. The retaining mechanism of the present disclosure is assembled with the circuit board in buckling, engaging and clamping manner. Assembly and disassembly of the circuit board is operated without external tools. The circuit board is constrained by resilient deformation of the first fixing component, the second fixing component, the third fixing component and the fourth fixing component. For instance, the up and down reciprocate movement of the circuit board in the first direction is constrained by the first fixing component, the left and right reciprocate movement of the circuit board in the second direction is constrained by the second fixing component, the third fixing component is an auxiliary unit to constrain the reciprocate movement of the circuit board in the first direction and the second direction, the front and rear reciprocate movement of the circuit board in the third direction is constrained by the fourth fixing component. The retaining mechanism of the present disclosure can automatically adjust assembly deviation to stably locate the circuit board into the supporter even through the circuit board does not accurately insert into the supporter.

These and other objectives of the present disclosure will no doubt become obvious to those of ordinary skill in the art after reading the following detailed description of the preferred embodiment that is illustrated in the various figures and drawings.

DETAILED DESCRIPTION

Figure 1:
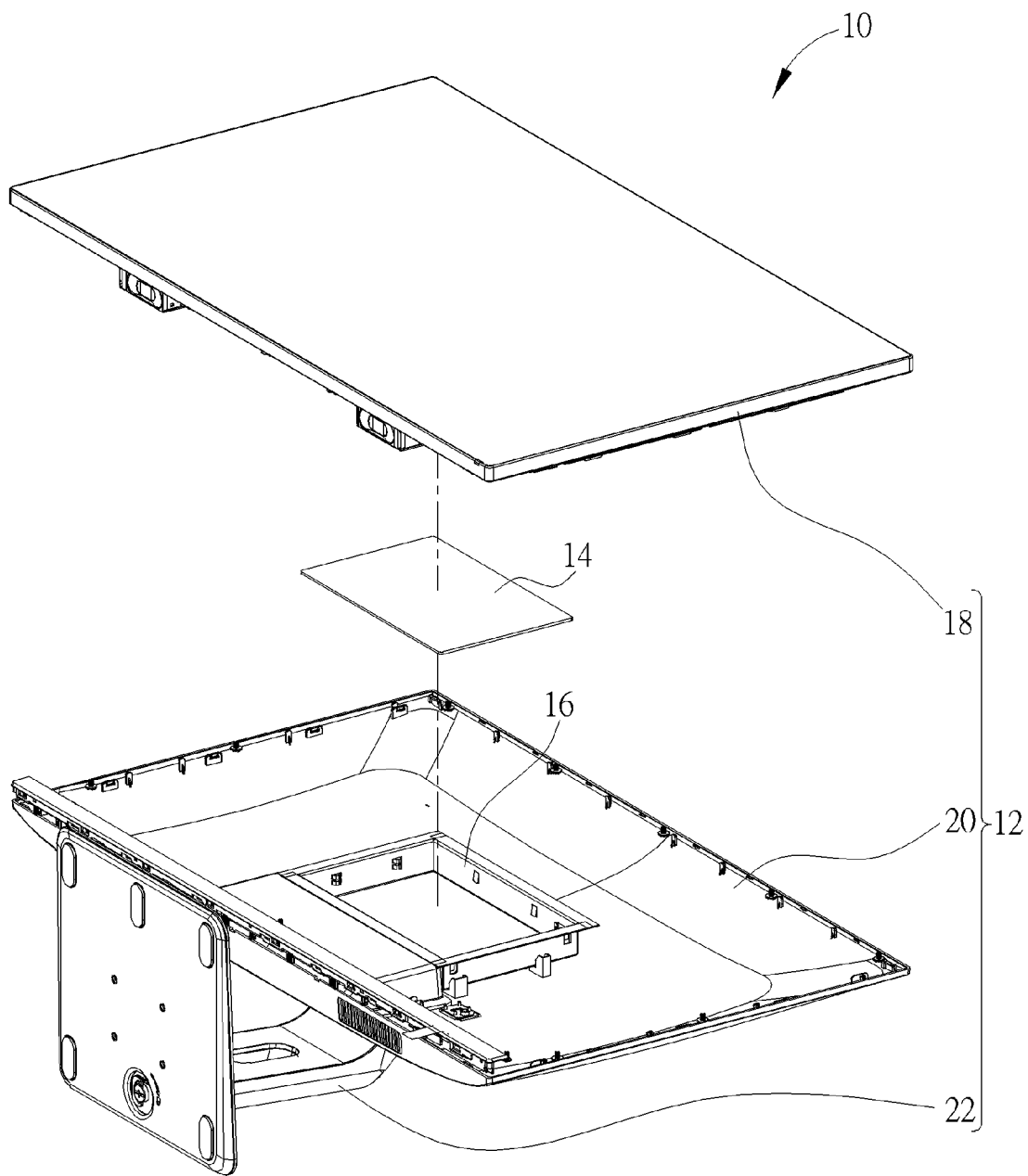
FIG. 1 is an exploded diagram of an electronic device according to an embodiment of the present disclosure.

Please refer to FIG. 1. FIG. 1 is an exploded diagram of an electronic device 10 according to an embodiment of the present disclosure. The electronic device 10 includes a housing 12, a circuit board 14 and a retaining mechanism 16. The electronic device 10 can be an all-in-one (AOI) display or any electronic product. The housing 12 includes an upper cover 18, a lower cover 20 and a pedestal 22. The lower cover 20 is connected to the pedestal 22. The circuit board 14 and the retaining mechanism 16 are disposed inside the lower cover 20, and the upper cover 18 is detachably assembled with the lower cover 20 to shelter the circuit board 14 and the retaining mechanism 16 for waterproof and dustproof functions. The electronic device 10 can stand upon a plane by the pedestal 22, such as setting on the table. The circuit board 14 may be a main board of the product, and is electrically connected to other electronic components, such as the memory, the hard disk and the processor, inside the housing 12 by a soft cable. The retaining mechanism 16 provides a quick assembling function that the circuit board 14 can be assembled and disassembled conveniently and rapidly.

Figure 2:
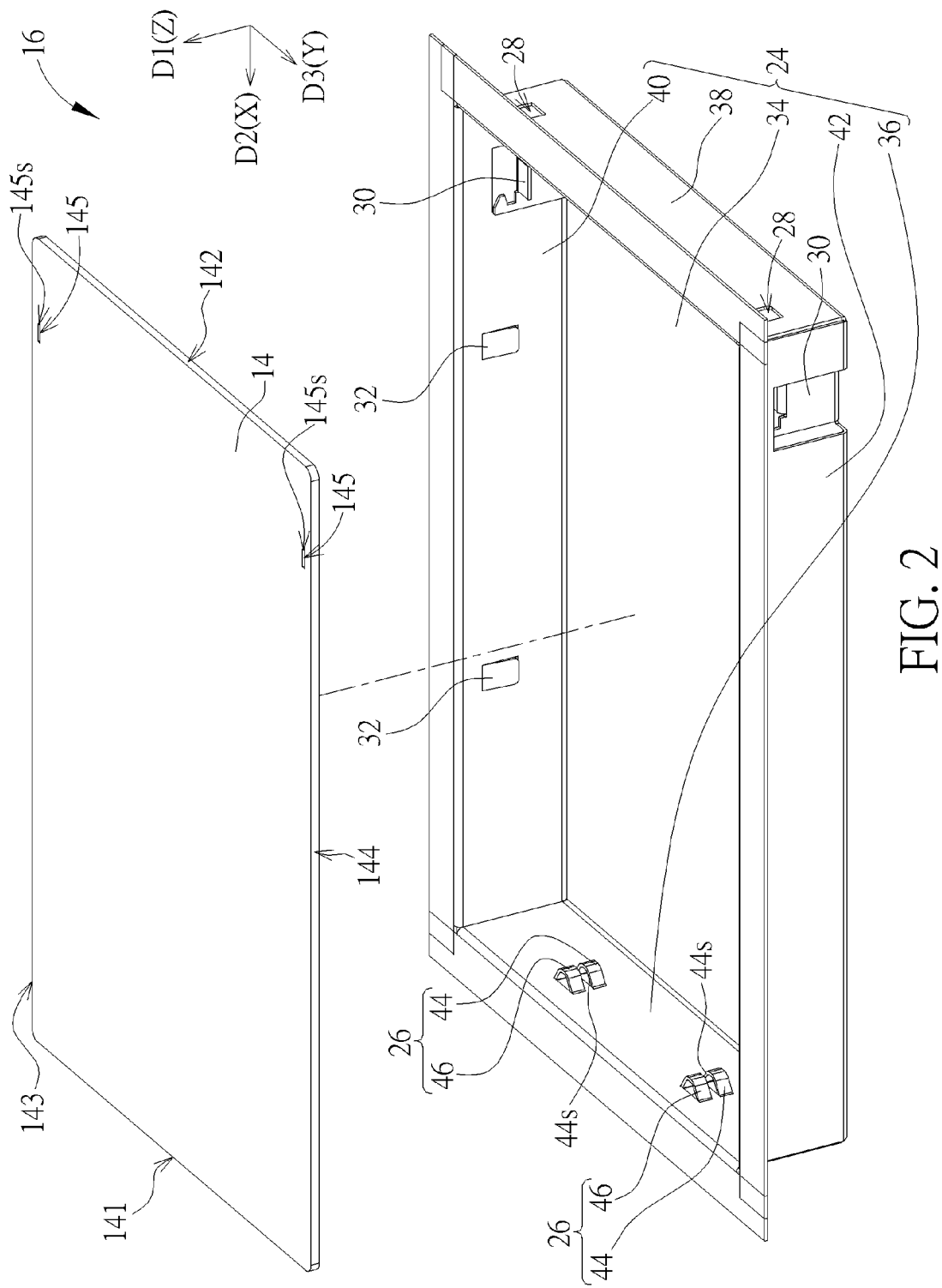
FIG. 2 and FIG. 3 respectively are diagrams of a retaining mechanism in different views according to the embodiment of the present disclosure.
Figure 3:
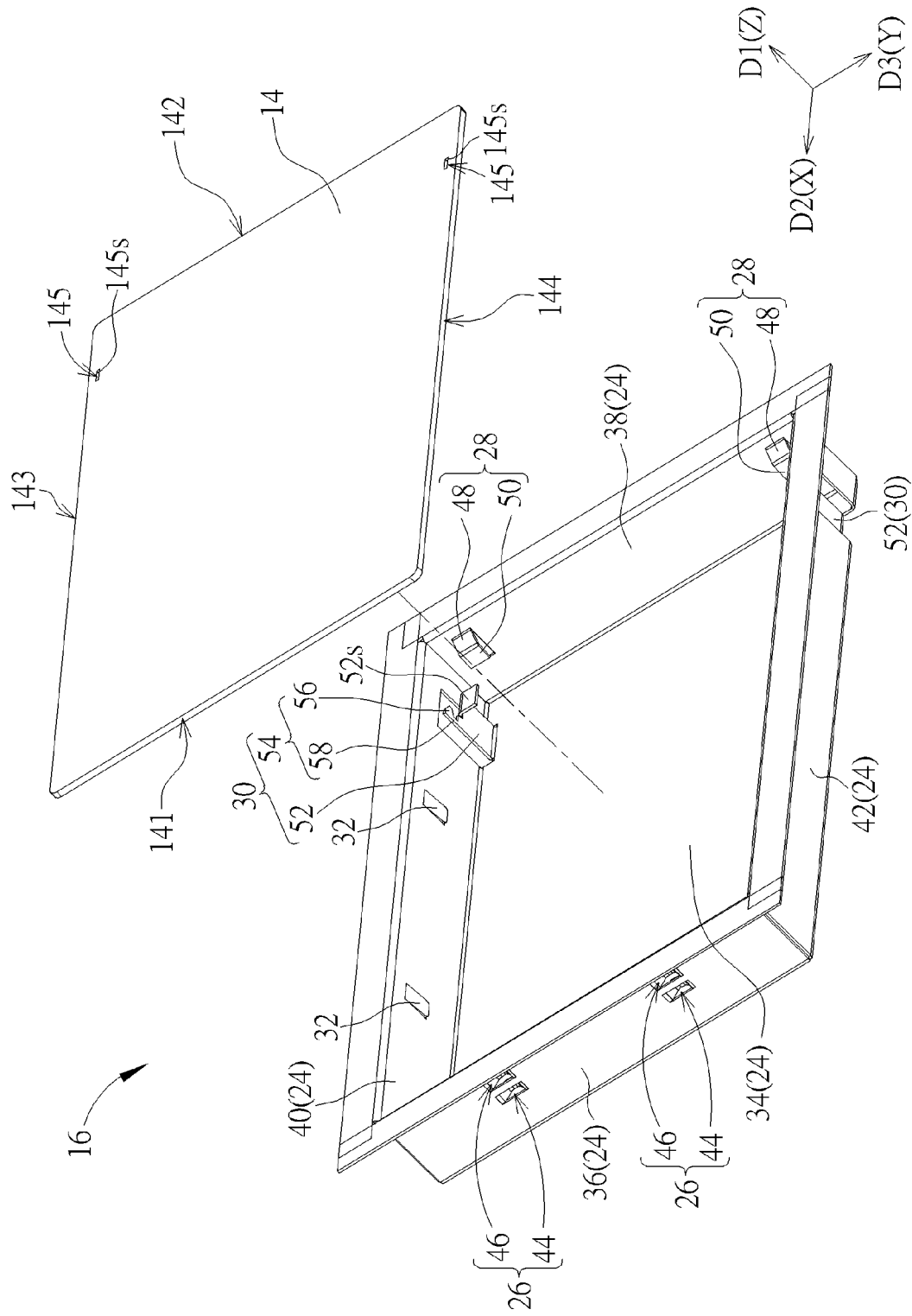

Please refer to FIG. 2 and FIG. 3. FIG. 2 and FIG. 3 respectively are diagrams of the retaining mechanism 16 in different views according to the embodiment of the present disclosure. The retaining mechanism 16 includes a supporter 24, a first fixing component 26, a second fixing component 28, a third fixing component 30 and a fourth fixing component 32. The supporter 24 is mainly composed of the base 34 and a plurality of supporting walls. An amount of the supporting wall is designed according to shapes of the base 34 or the circuit board 14. For example, the base 34 is a rectangular form, the supporter 24 includes, but not limited to, a first supporting wall 36, a second supporting wall 38, a third supporting wall 40 and a fourth supporting wall 42. In the embodiment, the first supporting wall 36 and the second supporting wall 38 are respectively disposed on opposite sides of the base 34, and the third supporting wall 40 and the fourth supporting wall 42 are respectively disposed on another opposite sides of the base 34. A rectangular space formed between the four supporting walls can be used to accommodate the circuit board 14.

As shown in FIG. 2, the first fixing component 26 is disposed on an inner surface of the first supporting wall 36 facing the base 34. The first fixing component 26 includes a first constraining portion 44 and a second constraining portion 46 disposed on the first supporting wall 36 in a first direction D1 (Z axis) and adjacent by each other. The first constraining portion 44 is utilized to hold the circuit board 14, and the second constraining portion 46 is utilized to press the circuit board 14. Thus, a gap is formed between the first constraining portion 44 and the second constraining portion 46, a first edge 141 of the circuit board 14 inserts into the gap and the circuit board 14 can be buckled by the first fixing component 26. As shown in FIG. 3, the second fixing component 28 includes a first slab portion 48 and a second slab portion 50 bent from each other. The first slab portion 48 is resiliently disposed between the second supporting wall 38 and the second slab portion 50. An end (which represents the first slab portion 48) of the second fixing component 28 is connected to an inner surface of the second supporting wall 38 facing the first supporting wall 36, and the other end (which represents the second slab portion 50) of the second fixing component 28 is adapted to obliquely press a second edge 142 of the circuit board 14 opposite to the first edge 141. The second fixing component 28 moves the circuit board 14 in a second direction D2 (X axis), and the circuit board 14 can be pushed into the gap between the first constraining portion 44 and the second constraining portion 46.

As shown in FIG. 3, the third fixing component 30 is disposed on the base 34 and located between the first supporting wall 36 and the second supporting wall 38, and preferably close to the second supporting wall 38. The third fixing component 30 includes a holding portion 52 and a hooking unit 54. The holding portion 52 stretches from the base 34 upward, and a distance between a holding surface 52s of the holding portion 52 and the base 34 is substantially equal to a distance between a distance between a constraining surface 44s of the first constraining portion 44 and the base 34. The holding portion 52 and the first constraining portion 44 respectively support different position of a bottom of the circuit board 14, and the circuit board 14 and the base 34 can be arranged in parallel. The hooking unit 54 is disposed adjacent by the holding portion 52, and mainly composed of a protruding portion 56 and a contacting portion 58. A bottom of the contacting portion 58 is connected to the holding portion 52. The protruding portion 56 is disposed on a lateral surface of a top of the contacting portion 58 and points toward the second fixing component 28, and is utilized to buckle an opening 145 formed on the circuit board 14. As shown in FIG. 2 and FIG. 3, an end of the fourth fixing component 32 is resiliently connected to the third supporting wall 40, and the other end of the fourth fixing component 32 contacts against a third edge 143 of the circuit board 14 different from the first edge 141 and the second edge 142, so as to push the circuit board 14 in a third direction D3 (Y axis).

It should be mentioned that the retaining mechanism 16 can dispose the fourth fixing component 32 on the fourth supporting wall 42 optionally, to abut against the fourth edge 144 of the circuit board 14. A plurality of fourth fixing components 32 disposed on the third supporting wall 40 and the fourth supporting wall 42 can buckle the circuit board 14 bilaterally for stable fixing efficiency. A shape of the fourth fixing component 32 can be designed as an arc board shown in FIG. 2 and FIG. 3, a flat board which is distortion of the arc board, or a flexural board which may be similar to the second fixing component 28. Any structure utilizing resilient deformation to buckle the circuit board 14 belongs to scope of the second fixing component 28 and/or the fourth fixing component 32 in the present disclosure, and a detailed description is omitted herein for simplicity. In addition, the supporter 24 is normally made of metal material (such as iron). The first fixing component 26, the second fixing component 28, the third fixing component 30 and the fourth fixing component 32 are formed on the supporter 24 by press stamping process, which provides advantages of resilient deformable property and low manufacturing cost.

Figure 4:
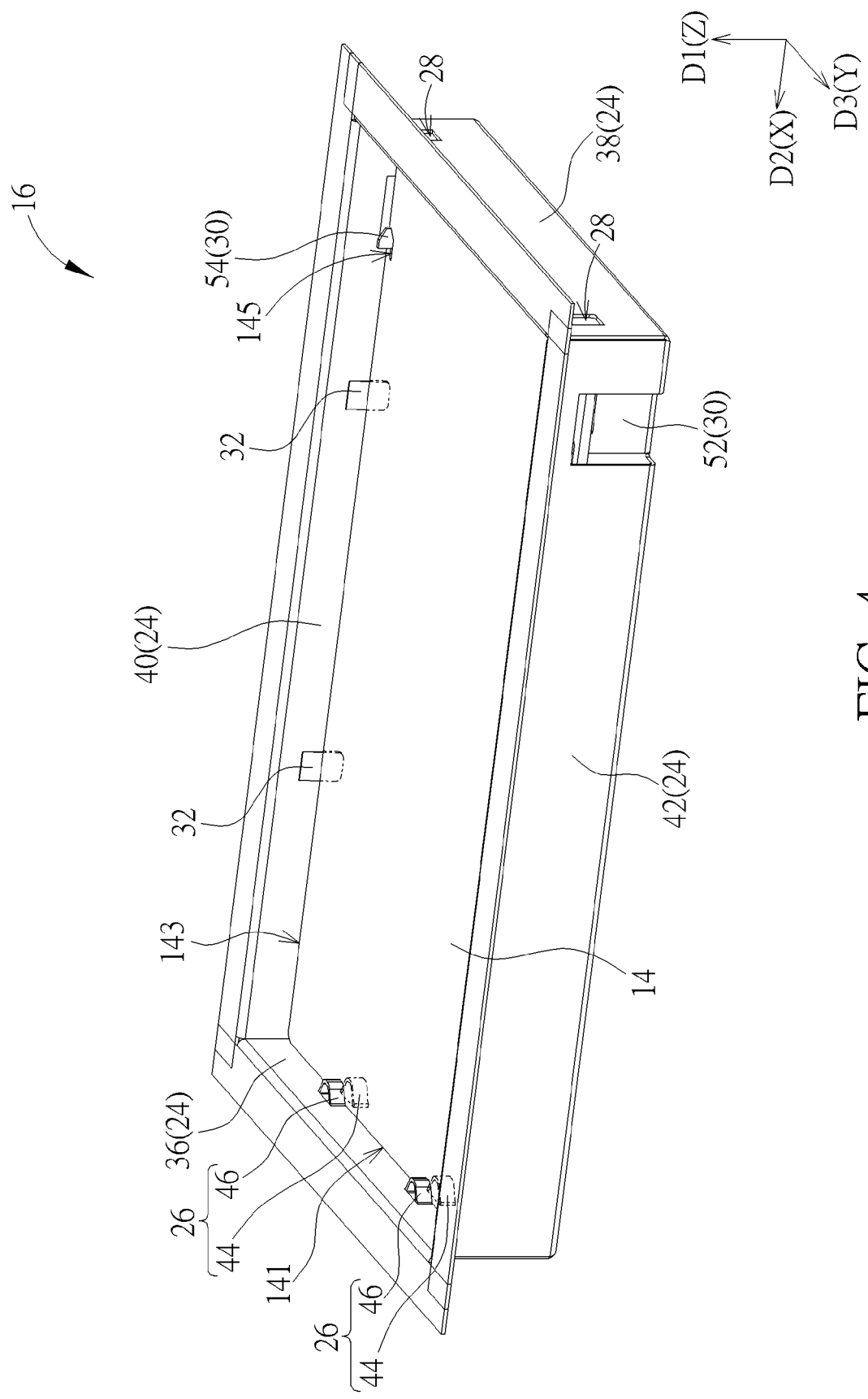
FIG. 4 and FIG. 5 are assembly diagrams of a circuit board and the retaining mechanism in different views according to the embodiment of the present disclosure.
Figure 5:
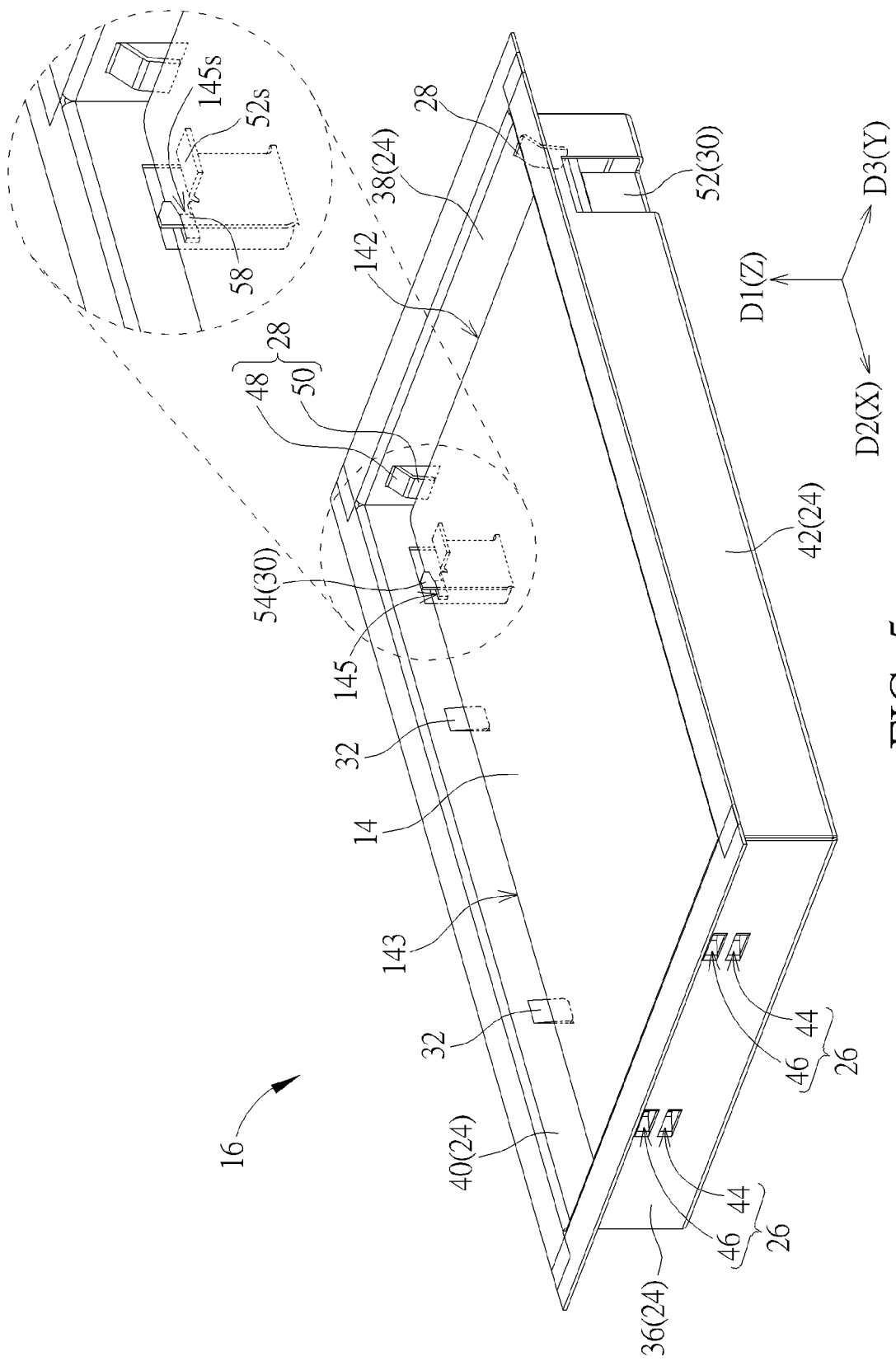
Figure 6:
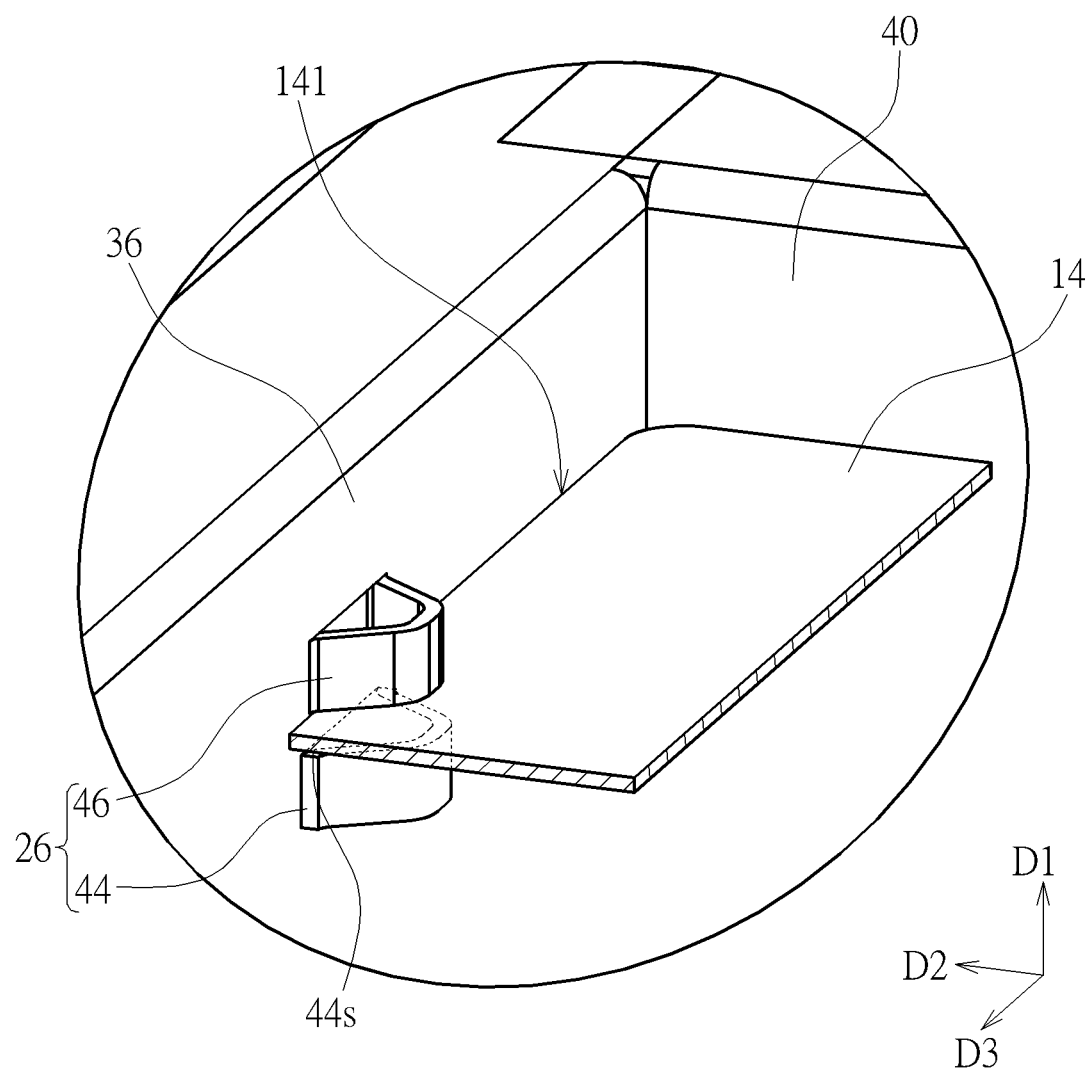
FIG. 6 is an enlarged diagram of a section A shown in FIG. 4 and FIG. 5 in another view.
Figure 7:
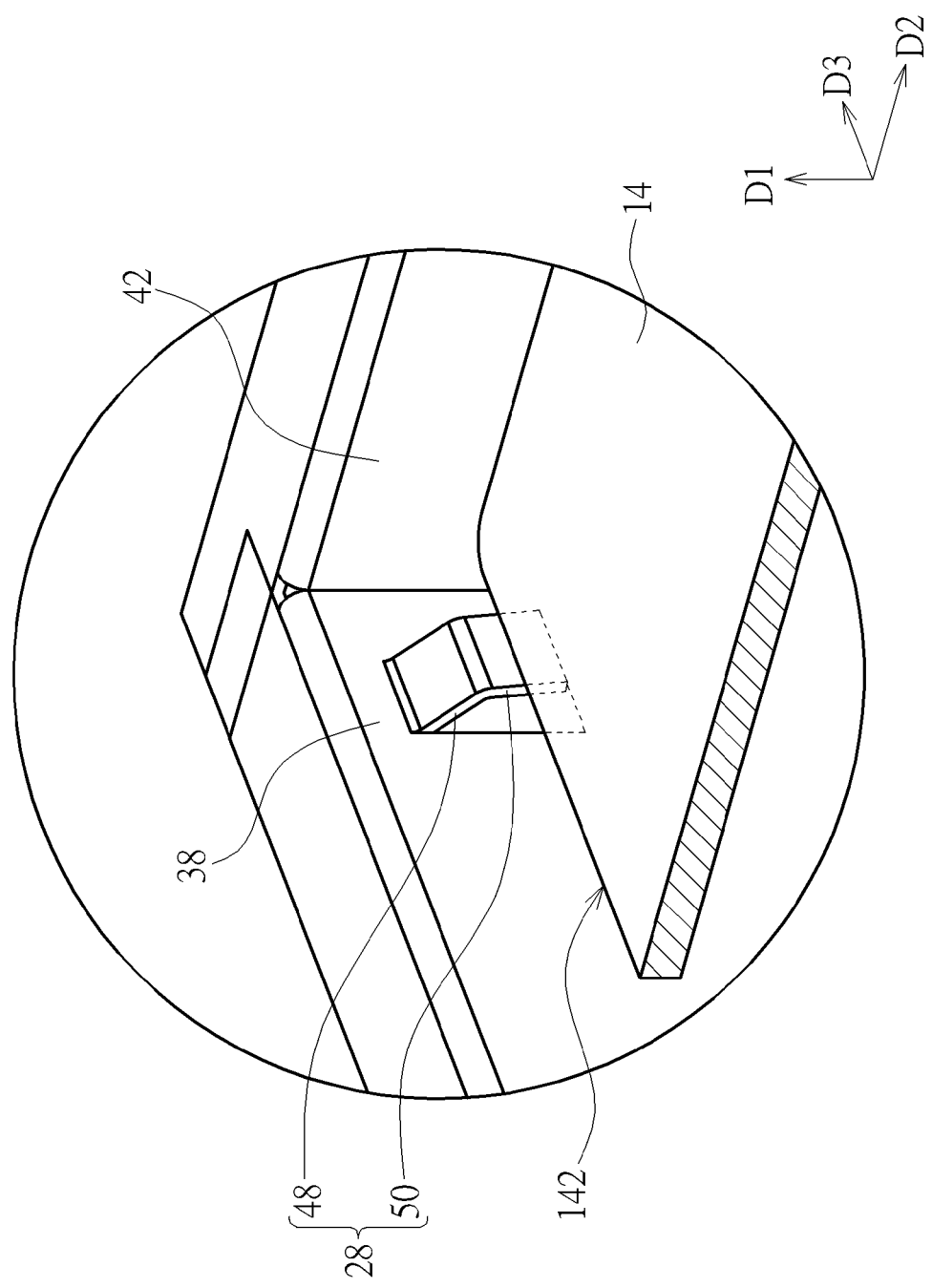
FIG. 7 is an enlarged diagram of a section B shown in FIG. 4 and FIG. 5 in another view.
Figure 8:
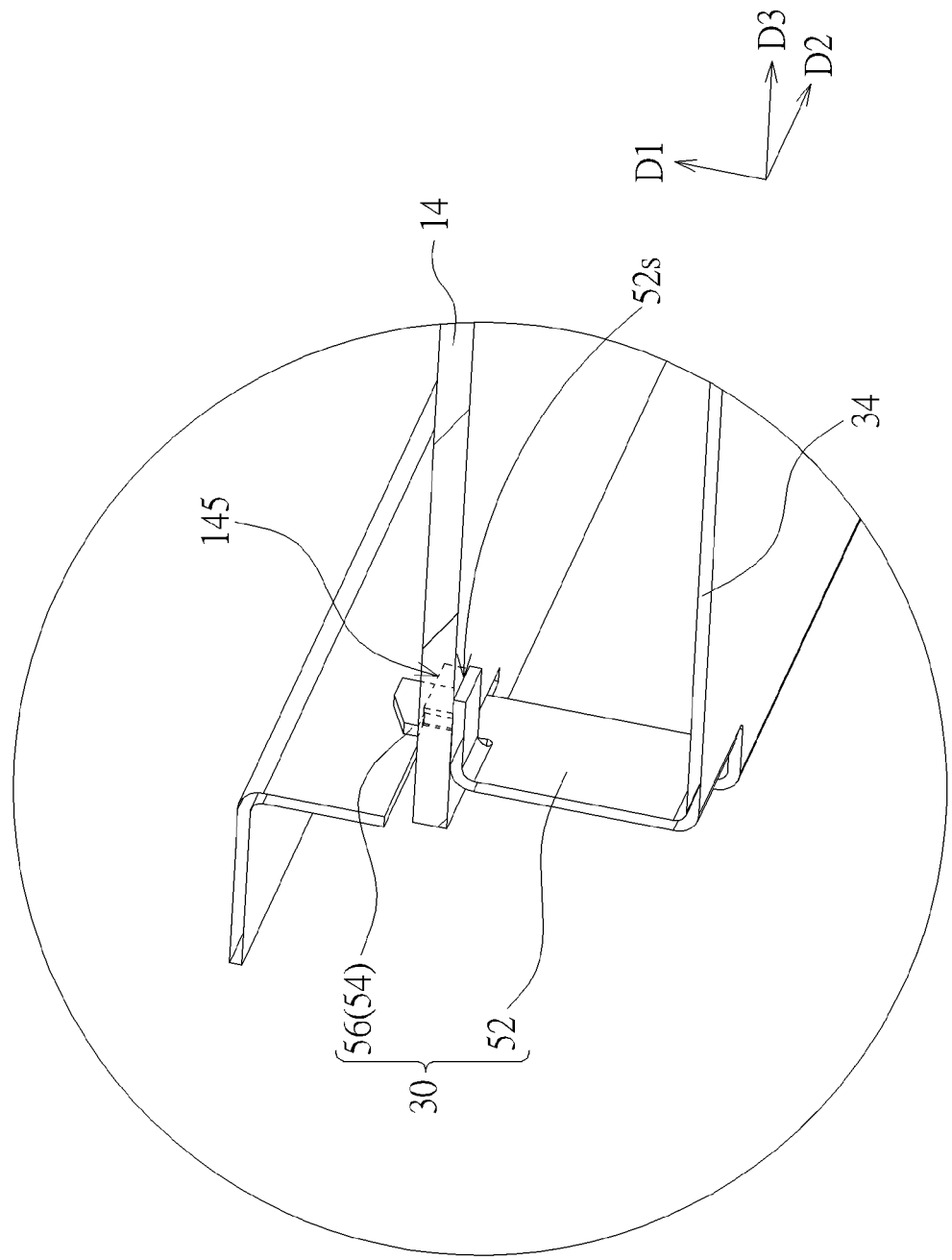
FIG. 8 is an enlarged diagram of a section C shown in FIG. 4 and FIG. 5 in another view.
Figure 9:
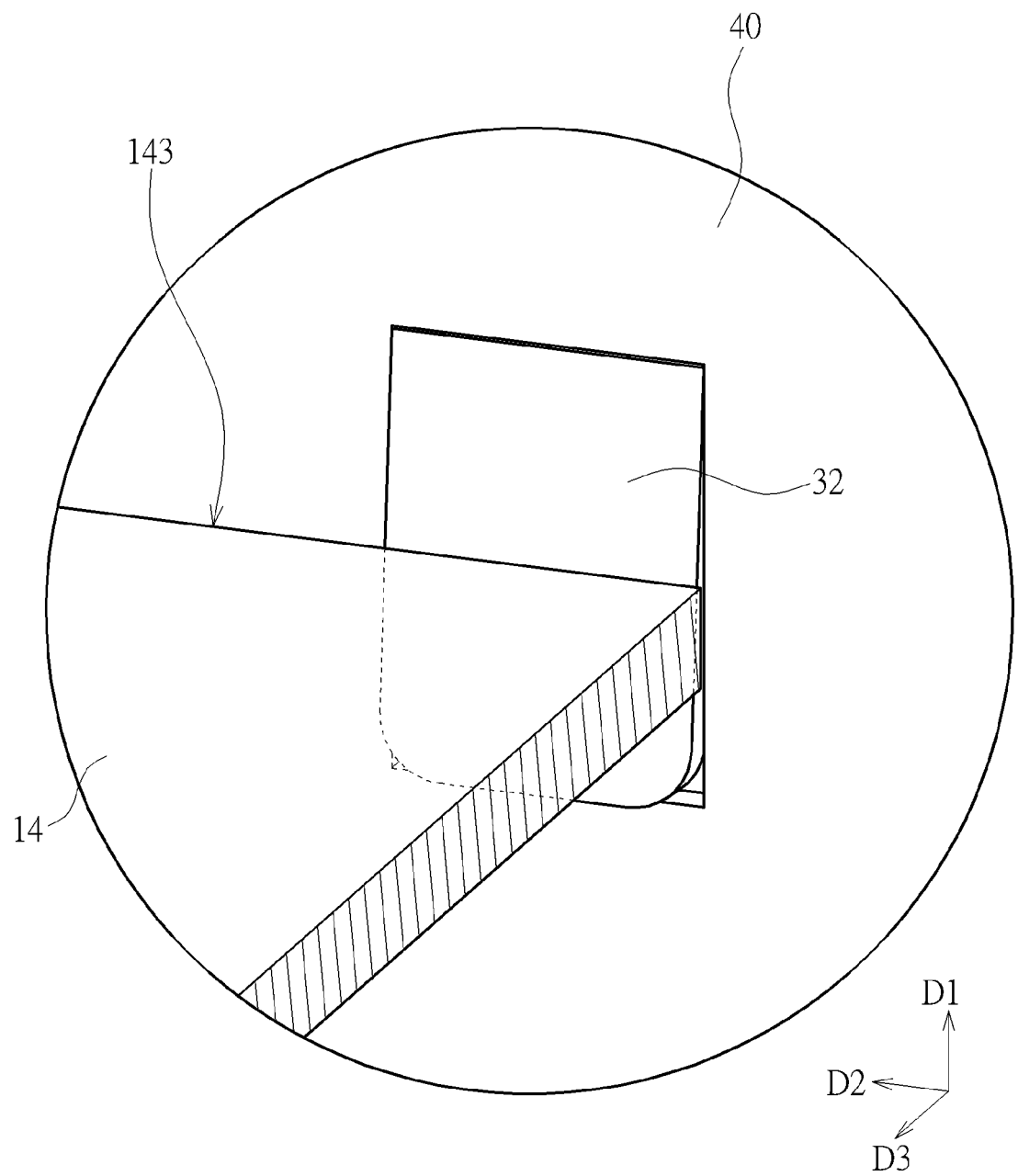
FIG. 9 is an enlarged diagram of a section D shown in FIG. 4 and FIG. 5 in another view.
Figure 10:
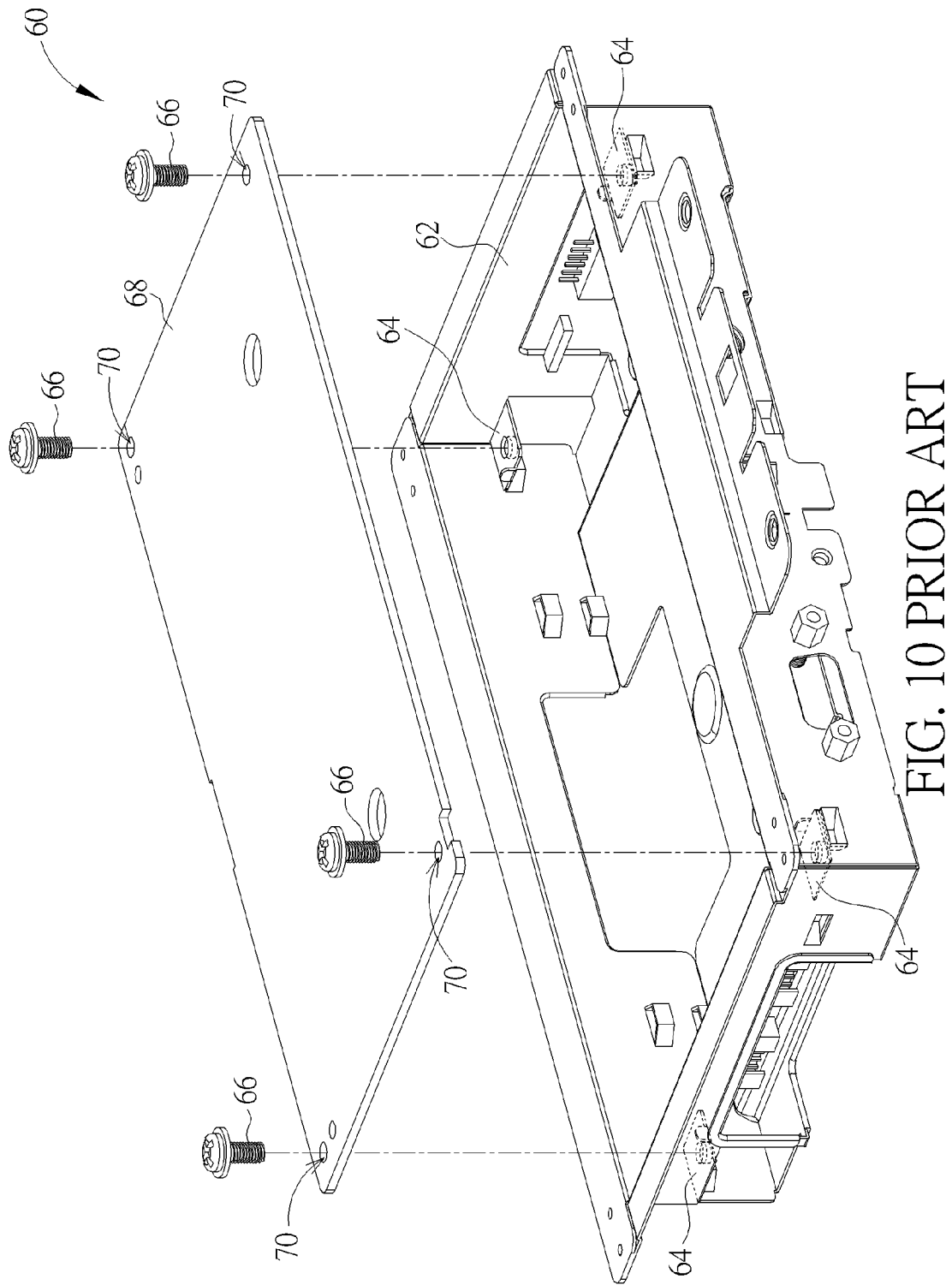
FIG. 10 is a conventional circuit board retaining mechanism in prior art.

Please refer to FIG. 4 to FIG. 9. FIG. 4 and FIG. 5 are assembly diagrams of the circuit board 14 and the retaining mechanism 16 in different views according to the embodiment of the present disclosure. FIG. 6 is an enlarged diagram of a section A shown in FIG. 4 and FIG. 5 in another view. FIG. 7 is an enlarged diagram of a section B shown in FIG. 4 and FIG. 5 in another view. FIG. 8 is an enlarged diagram of a section C shown in FIG. 4 and FIG. 5 in another view. FIG. 9 is an enlarged diagram of a section D shown in FIG. 4 and FIG. 5 in another view. As shown in FIG. 6, the first constraining portion 44 and the second constraining portion 46 are disposed on the first supporting wall 36 along the first direction D1, opposite surfaces of the circuit board 14 are respectively held and pressed by the first constraining portion 44 and the second constraining portion 46, and a reciprocate movement of the circuit board 14 in the first direction D1 can be constrained by the first fixing component 26. The first constraining portion 44 and the second constraining portion 46 are the arc structures, but not limited to, formed on the first supporting wall 36 by the press stamping process.

As shown in FIG. 7, an angle formed between the first slab portion 48 and the second slab portion 50 is greater than 90 degrees, and a boundary between the first slab portion 48 and the second slab portion 50 is located above the circuit board 14. The second fixing component 28 can press the circuit board 14 in an oblique contacting manner, and a resilient recovering force of the second fixing component 28 pushes the circuit board 14 to insert into the gap between the two constraining portions of the first fixing component 26, to prevent the circuit board 14 from being separated from the first fixing component 26 in the second direction D2. The second slab portion 50 downwardly presses the circuit board 14 to prevent the circuit board 14 from being moved upward and separated from the second fixing component 28. As shown in FIG. 5 and FIG. 8, the hooking unit 54 passes through the opening 145, an inner wall 145s (which is illustrated in FIG. 2 and FIG. 3) of the opening 145 can abut against the contacting portion 58 while the second fixing component 28 pushes the circuit board 14 in the second direction D2. Due to the resilient recovering force of the second fixing component 28, a part of the circuit board 14 can be tightly buckled between the second fixing component 28 and the third fixing component 30, and a movement of the circuit board in the second direction D2 is constrained accordingly. The protruding portion 56 presses upon the circuit board 14, and the circuit board 14 cannot be separated from the holding portion 52 in the first direction D1 by constraint of the hooking unit 54. As shown in FIG. 9, the fourth fixing component 32 laterally pushes the circuit board 14 via the third edge 143 and/or the fourth edge 144, so as to avoid the circuit board 14 from accident shift in the third direction D3. The fourth fixing component 32 is an auxiliary component optionally utilized.

For assembling the circuit board 14 with the retaining mechanism 16, the first edge 141 of the circuit board 14 obliquely inserts into the first fixing component 26, and then the second edge 142 of the circuit board 14 is descended to dispose the opening 145 of the circuit board 14 on the hooking unit 54 of the third fixing component 30. The circuit board 14 can be manually pressed to generate resilient deformation of the second fixing component 28 by the second edge 142 of the circuit board 14, the circuit board 14 can move under the boundary between the first slab portion 48 and the second slab portion 50, and the circuit board 14 can be tightly engaged with the first fixing component 26 and the third fixing component 30 by the resilient recovering force of the second fixing component 28. Meanwhile, the fourth fixing component 32 laterally presses the third edge 143 and/or the fourth edge 144 of circuit board 14, to stably position the circuit board 14 inside the retaining mechanism 16. For disassembling the circuit board 14 from the retaining mechanism 16, the second fixing component 28 is manually pressed to lift the second edge 142 of the circuit board 14, the second edge 142 moves across the second fixing component 28 for removal of structural interference. While the circuit board 14 is lifted and separated from constraint of the third fixing component 30 and the fourth fixing component 32, the first edge 141 of the circuit board 14 can be obliquely pulled out of the first fixing component 26, so as to disassemble the circuit board 14 from the retaining mechanism 16 completely.

In conclusion, the retaining mechanism of the present disclosure disposes the first fixing component, the second fixing component, the third fixing component and the fourth fixing component around the supporter. An amount of each fixing component can be one or more. In the embodiment, each fixing component has two members symmetrically disposed on the corresponding supporting wall of the supporter. Comparing to the prior art, the retaining mechanism of the present disclosure is assembled with the circuit board in buckling, engaging and clamping manner. Assembly and disassembly of the circuit board is manually operated without external tools. The circuit board is constrained by the resilient deformation of the first fixing component, the second fixing component, the third fixing component and the fourth fixing component. For instance, the up and down reciprocate movement of the circuit board in the first direction is constrained by the first fixing component, the left and right reciprocate movement of the circuit board in the second direction is constrained by the second fixing component, the third fixing component is an auxiliary unit to constrain the reciprocate movement of the circuit board in the first direction and the second direction, the front and rear reciprocate movement of the circuit board in the third direction is constrained by the fourth fixing component. The retaining mechanism of the present disclosure can automatically adjust assembly deviation to stably locate the circuit board into the supporter even through the circuit board does not accurately insert into the supporter.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A retaining mechanism for holding a circuit board, the retaining mechanism comprising:
   a supporter, the supporter having a base, a first supporting wall and a second supporting wall, the first supporting wall and the second supporting wall being respectively disposed on opposite sides of the base;
   a first fixing component disposed on a surface of the first supporting wall facing the base, the first fixing component being adapted to clamp opposite surfaces of a first edge of the circuit board to constrain a reciprocate movement of the circuit board in a first direction;
   a second fixing component, an end of the second fixing component being resiliently connected to a surface of the second supporting wall facing the first supporting wall, and the other end of the second fixing component contacting against a second edge of the circuit board opposite to the first edge to push the circuit board toward the first fixing component in a second direction different from the first direction so as to constrain a reciprocate movement of the circuit board from being separated from the first fixing component in the second direction; and
   a third fixing component disposed on the base and located between the first supporting wall and the second supporting wall, the third fixing component comprising a holding portion adapted to hold a bottom of the circuit board and a hooking unit disposed adjacent by the holding portion, the hooking unit being buckled with an opening formed on the circuit board to constrain a relative movement of the circuit board and the holding portion, wherein the hooking unit comprises a protruding portion and a contacting portion, the contacting portion is connected to the holding portion, and the protruding portion is disposed on a lateral surface of the contacting portion and points toward the second fixing component.

2. The retaining mechanism of claim 1, wherein the first fixing component comprises a first constraining portion and a second constraining portion disposed on the first supporting wall along the first direction and adjacent by each other, opposite surfaces of the circuit board are respectively held and pressed by the first constraining portion and the second constraining portion.

3. The retaining mechanism of claim 2, wherein a distance between the holding portion and the base is substantially equal to a distance between the first constraining portion and the base.

4. The retaining mechanism of claim 1, wherein the second fixing component comprises a first slab portion and a second slab portion bent from each other, the first slab portion is resiliently disposed between the second supporting wall and the second slab portion, and the second slab portion is adapted to obliquely press the circuit board.

5. The retaining mechanism of claim 1, wherein the second fixing component pushes the circuit board to abut an inner wall of the opening on the circuit board against the contacting portion.

6. The retaining mechanism of claim 1, wherein the supporter further comprises a third supporting wall disposed on a side of the base different from the first supporting wall and the second supporting wall, the retaining mechanism further comprises a fourth fixing component, an end of the fourth fixing component is resiliently connected to the third supporting wall, and the other end of the fourth fixing component contacts against a third edge of the circuit board different from the first edge and the second edge, so as to move the circuit board in a third direction different from the first direction and the second direction.

7. The retaining mechanism of claim 6, wherein the fourth fixing component is an arc board, a flat board or a flexural board.

8. The retaining mechanism of claim 6, wherein the first fixing component, the second fixing component, the third fixing component and the fourth fixing component are formed on the supporter by press stamping process.

9. An electronic device having a quick assembling function, comprising:
   a housing;
   a circuit board; and
   a retaining mechanism for holding the circuit board inside the housing, the retaining mechanism comprising:
      a supporter disposed inside the housing to accommodate the circuit board, the supporter having a base, a first supporting wall and a second supporting wall, the first supporting wall and the second supporting wall being respectively disposed on opposite sides of the base;
      a first fixing component disposed on a surface of the first supporting wall facing the base, the first fixing component being adapted to clamp opposite surfaces a first edge of the circuit board to constrain a reciprocate movement of the circuit board in a first direction;
      a second fixing component, an end of the second fixing component being resiliently connected to a surface of the second supporting wall facing the first supporting wall, and the other end of the second fixing component contacting against a second edge of the circuit board opposite to the first edge to push the circuit board toward the first fixing component in a second direction different from the first direction so as to constrain a reciprocate movement of the circuit board from being separated from the first fixing component in the second direction different from the first direction; and a third fixing component disposed on the base and located between the first supporting wall and the second supporting wall, the third fixing component comprising a holding portion adapted to hold a bottom of the circuit board and a hooking unit disposed adjacent by the holding portion, the hooking unit being buckled with an opening formed on the circuit board to constrain a relative movement of the circuit board and the holding portion, wherein the hooking unit comprises a protruding portion and a contacting portion, the contacting portion is connected to the holding portion, and the protruding portion is disposed on a lateral surface of the contacting portion and points toward the second fixing component.

10. The electronic device of claim 9, wherein the first fixing component comprises a first constraining portion and a second constraining portion disposed on the first supporting wall along the first direction and adjacent by each other, opposite surfaces of the circuit board are respectively held and pressed by the first constraining portion and the second constraining portion.

11. The electronic device of claim 10, wherein a distance between the holding portion and the base is substantially equal to a distance between the first constraining portion and the base.

12. The electronic device of claim 9, wherein the second fixing component comprises a first slab portion and a second slab portion bent from each other, the first slab portion is resiliently disposed between the second supporting wall and the second slab portion, and the second slab portion is adapted to obliquely press the circuit board.

13. The electronic device of claim 9, wherein the second fixing component pushes the circuit board to abut an inner wall of the opening on the circuit board against the contacting portion.

14. The electronic device of claim 9, wherein the supporter further comprises a third supporting wall disposed on a side of the base different from the first supporting wall and the second supporting wall, the retaining mechanism further comprises a fourth fixing component, an end of the fourth fixing component is resiliently connected to the third supporting wall, and the other end of the fourth fixing component contacts against a third edge of the circuit board different from the first edge and the second edge, so as to move the circuit board in a third direction different from the first direction and the second direction.

15. The electronic device of claim 14, wherein the fourth fixing component is an arc board, a flat board or a flexural board.

16. The electronic device of claim 14, wherein the first fixing component, the second fixing component, the third fixing component and the fourth fixing component are formed on the supporter by press stamping process.

17. The electronic device of claim 9, wherein the housing comprises an upper cover and a lower cover, the circuit board and the retaining mechanism are disposed inside the lower cover, and the upper cover is detachably assembled with the lower cover to shelter the circuit board and the retaining mechanism.

* * * * *